INVENTOR.
James E. Lindsay
BY
H. L. Newton
ATTORNEY.

June 26, 1962 J. E. LINDSAY 3,041,544

STABILIZED SIGNAL AMPLIFIER CIRCUITS EMPLOYING TRANSISTORS

Original Filed Nov. 30, 1954 2 Sheets-Sheet 2

INVENTOR.
JAMES E. LINDSAY
BY
W. H. Sprague
ATTORNEY 3,041,544

STABILIZED SIGNAL AMPLIFIER CIRCUITS EMPLOYING TRANSISTORS

James E. Lindsay, Moorestown, N.J., assignor to Radio Corporation of America, a corporation of Delaware Continuation of abandoned application Ser. No. 472,042, Nov. 30, 1954. This application Nov. 18, 1957, Ser. No. 697,283
8 Claims. (Cl. 330—24)

Figure 1:
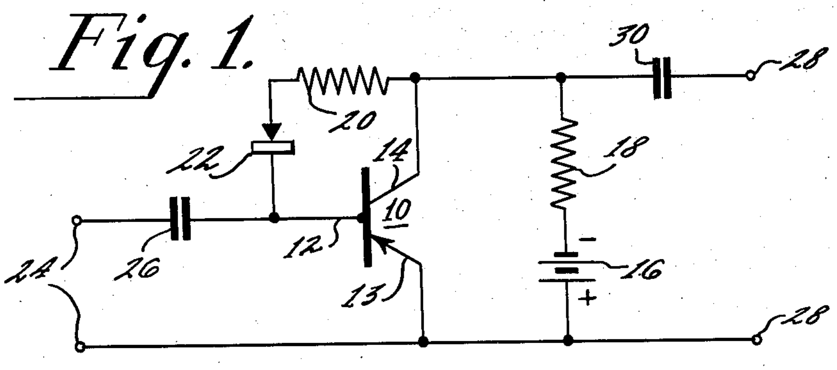

This invention relates generally to transistor signal circuits and particularly to stabilized transistor signal amplifier circuits in which feedback is utilized. The present application is a continuation of application Serial No. 472,042 filed on November 30, 1954, for "Stabilized Signal Amplifier Circuits Employing Transistors," now abandoned.

It has been found that both the dynamic and static characteristics of transistors vary appreciably from one unit to another even though effort is directed toward making them identical with each other. Accordingly, a circuit which has been adjusted to operate satisfactorily with one transistor may be found to be less satisfactory or even inoperative with a second transistor due to the difference in transistor characteristics.

Various feedback methods have been utilized to stabilize the operating point of transistors utilized in signal amplifier circuits. One method which has been found to provide compensation for transistors having a relatively wide variation in characteristics is to connect a feedback resistor between the collector and base electrodes of a transistor, and to provide energizing currents to the collector and emitter electrodes from a direct current source having a relatively high internal resistance. Variations in transistor characteristics then tends to vary the collector voltage, which in turn varies the amount of bias current supplied to the base electrode in such a direction to reduce the collector voltage variation.

Stabilization is achieved in this method by virtue of direct current negative feedback applied from the collector electrode to the base electrode through the feedback resistor. The magnitude of the resistance used is determined in general by the amount of bias current required by the base electrode for operation of the transistor at a desired or prescribed operating point. The amount of feedback which may be applied by use of this simple method is therefore restricted by the amount of bias current required. If the feedback resistance is reduced in magnitude, for example, the stabilization will be increased; the bias current, however, will also be increased and may be too high for the application.

Accordingly, it is an object of the present invention to provide an improved transistor amplifier circuit wherein stable and reliable operation is obtained with transistors having different operating characteristics.

A further object of the invention is to provide an improved direct current stabilized amplifier circuit which utilizes transistors efficiently and effectively to provide a high degree of stabilization.

It is a still further object of the invention to provide an improved transistor signal amplifier circuit utilizing feedback stabilization wherein simple, efficient circuit means are used to exercise separate control over the degree of stabilization and the direct bias current.

It is another object of the invention to provide an improved transistor signal amplifier circuit wherein simple and efficient means are utilized to provide a large degree of stabilization without a concomitant increase in bias current.

In accordance with the present invention, there is provided a transistor having emitter and collector electrodes connected to a source of energizing current having a relatively high internal resistance. The transistor further includes a base electrode to which bias current is supplied by connecting a direct current conductive means having a relatively low dynamic impedance and providing an appreciable voltage drop directly between the base and collector electrodes. Direct current operating point stabilization is provided concomitantly with the base bias current by virtue of the direct current feedback means between the collector and base electrodes.

The feedback means may include a series element such as a diode operating in a region in which its dynamic resistance is relatively low and providing an appreciable voltage drop between its terminals. The direct current operating point stabilization, being dependent upon the magnitude of resistance in the feedback path between the collector and base electrodes, may therefore be relatively high, while the bias current for the base electrode may be independently adjusted by choice of the series element.

Figure 2:
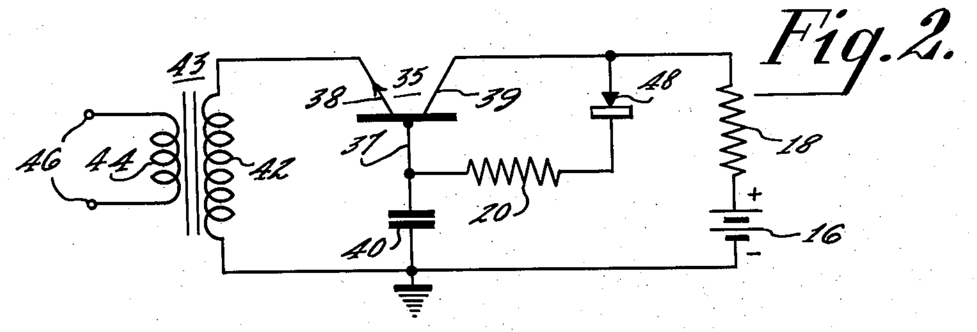
Figure 3:
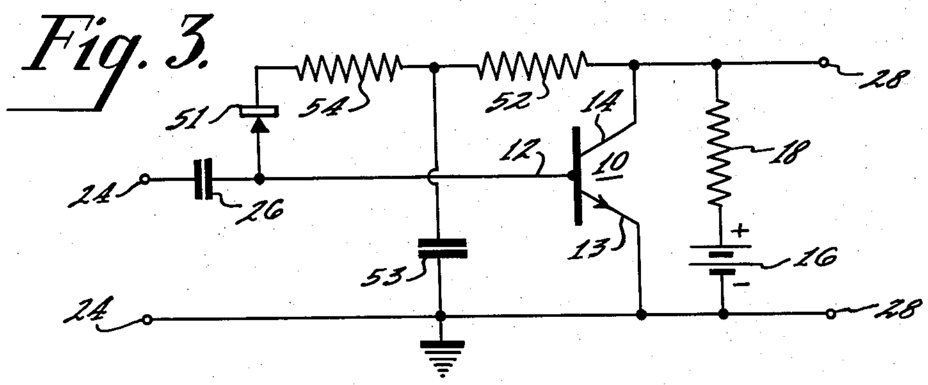
Figure 1A:
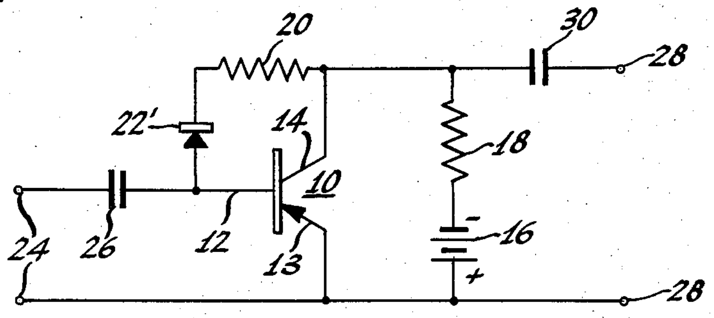
Figure 2A:
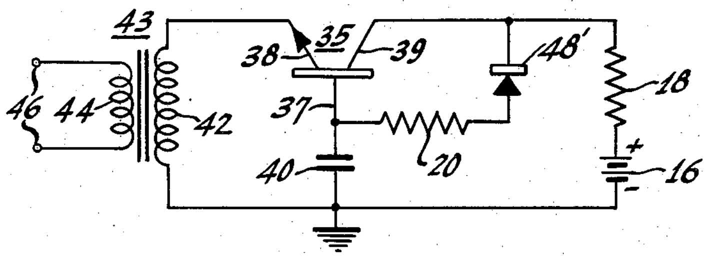

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

FIGURE 1 is a schematic circuit diagram of an amplifier circuit incorporating a stabilizing circuit illustrating one embodiment of the present invention;

FIGURE 1*a* is a schematic circuit diagram of an amplifier embodying the invention and is a modification of the circuit of FIGURE 1;

FIGURE 2 is a schematic circuit diagram of a transistor amplifier circuit utilizing transformer coupling and incorporating a stabilizing circuit illustrating another embodiment of the present invention;

FIGURE 2*a* is a schematic circuit diagram of an amplifier embodying the invention and is a modification of the circuit of FIGURE 2; and FIGURE 3 is a schematic circuit diagram of an amplifier circuit including a stabilizing circuit in accordance with still another embodiment of the invention wherein signal degeneration is avoided.

Referring now to the drawing wherein like elements are designated by like reference numerals throughout the various figures and referring particularly to FIGURE 1, a transistor 10 having a base electrode 12 an emitter electrode 13 and a collector electrode 14 is of the type having, under operating conditions, a ratio of collector current increments to emitter current increments which is less than unity. A unit of this type, of which the junction transistor is an example, thereby provides a signal phase reversal between the base electrode 12 and the collector electrode 14.

Energizing current is supplied from a source of current having an appreciable internal resistance, shown for illustrative purposes to consist of the series combination of a battery 16 and a load resistor 18 connected between the emitter electrode 13 and the collector electrode 14. Bias current for the base electrode is provided concomitantly with direct current operating point stabilization by a direct current conductive means connected between the collector electrode 14 and the base electrode 12.

This means may consist of the series combination of a resistor 20 and a device having a low dynamic resistance compared with the ratio of the voltage drop thereacross to the current flow therethrough, illustrated in FIGURE 1 as a semi-conductor diode 22 biased in the region of breakdown, sometimes referred to as the Zener region.

Input signals may be applied to a pair of input terminals 24, one of which is coupled to the base electrode 12 through a coupling capacitor 26, and the other of which is connected to the emitter electrode 13.

Output signals may be derived at a pair of output terminals 28, one of which is connected to the emitter electrode 13 and the other of which is coupled through a capacitor 30 to the collector electrode 14.

In operation, variation in the voltage at the collector electrode 14, due to variation in the characteristics of the transistor 10, will be coupled to the base electrode 12 through the series combination of the resistor 20 and the diode 22. These variations will be in such a direction as to reduce the collector voltage variation. If the collector voltage tends to rise for instance, the bias current flowing out of the base electrode 12 will tend to increase, thereby causing an increase in collector current and a reduction in collector voltage, due to the increased voltage drop in the load resistor 18.

For this feedback action to be most effective, the feedback resistor 20 should have as low resistance as possible. Use of the Zener diode 22 increases the series resistance in the feedback path very little, but by virtue of the voltage drop across it, permits the value of resistance of the resistor 20 to be made as small as desired, while still maintaining an appropriate amount of bias current.

The bias circuit of the present invention, connected between the collector electrode 14 and the base electrode 12, thus provides a voltage drop in excess of the product of the current flow therethrough and the dynamic resistance thereof.

FIGURE 1*a*, to which reference now is made, is similar to that shown in and described with reference to FIGURE 1. The only difference is that the diode 22′ is connected in a polarity reversed to that shown in FIGURE 1 so that it is biased in a forward direction. The bias circuit connected between the collector electrode 14 of the base electrode 12 provides the desired voltage drop in excess of the product of the current flow therethrough and the dynamic resistance thereof by virtue of the operating character of the diode 22′ biased in a forward direction.

In FIGURE 2, to which reference is now made, a transistor 35, shown for illustrative purposes to be of the N-P-N type, includes a base electrode 37 connected to ground for signal frequencies through a capacitor 40. Input signals are applied between the emitter electrode 38 of the transistor 35 and ground from the secondary winding 42 of an input transformer 43, the primary winding 44 of which is connected to a pair of input terminals 46, to which signals to be amplified may be applied.

Energizing current is applied to the collector electrode 39 of the transistor 35 from a source of energizing potential illustrated as a battery 16, the positive terminal of which is connected through a load resistor 18 to the collector electrode 39, the negative terminal being connected to ground.

Base current bias is supplied by connecting the series combination of a resistor 20 and a diode 48 between the collector electrode 39 and the base electrode 37.

In operation, input signals are applied between the emitter electrode 38 and the base electrode 37 of the transistor 35. They are amplified by the transistor and appear between the collector electrode 39 and ground, across the load resistor 18. This type of amplifier circuit is known as the common base or grounded base amplifier stage.

The biasing arrangement for this circuit is similar to that described with reference to the circuit of FIGURE 1 to which reference is jointly made, except that while the diode 22 in FIGURE 1 is biased into the Zener region by poling it in what is normally the reverse direction or direction of low conductivity, the diode 48 in FIGURE 2 is biased in a forward direction. A semiconductor diode operating in this region will have a voltage-current characteristic wherein the dynamic resistance is relatively low, while the voltage drop across the diode may be substantial. It is thus seen that the diode 48, poled in the forward direction, operates in a manner similar to that of the diode 22 poled in the reverse direction to allow the feedback resistor 20 to have a lower value of resistance, thereby to increase the stabilization without a concomitant increase in base current bias.

FIGURE 2*a*, to which reference now is made, has the same configuration as FIGURE 2. The only difference is that the diode 48′ is connected in a polarity reversed to that shown for the diode 48′ of FIGURE 2. By such a connection, the diode 48′ is biased in a reverse direction so as to cause it to operate in the Zener region. Again the operation of the circuit of FIGURE 2*a* is the same as that described with reference to FIGURE 2.

Reference is now made to FIGURE 3, wherein a transistor 10 includes a base electrode 12, an emitter electrode 13 and a collector electrode 14 connected in a circuit similar to that shown in FIGURE 1 to which reference is jointly made. The battery 16 and the load resistor 18 are connected in series between the collector electrode 14 and the emitter electrode 13 to provide energizing current for the transistor 10, which is shown to be of the N-P-N type. The battery 16 must therefore be poled oppositely to that of FIGURE 1, wherein a P-N-P transistor is utilized.

Input signals, applied to a pair of input terminals 24 one of which is connected to ground, are coupled to the base electrode 12 through a coupling capacitor 26. The emitter electrode 13 is connected to ground.

Bias current is supplied to the base electrode 12 by connecting the series combination of the diode 51 and a resistor 54 and a resistor 52 directly between the base electrode 12 and the collector electrode 14. Signal voltages appearing in the feedback path between the collector electrode 14 and the base electrode 12 are shunted to ground through a by-pass capacitor 53 connected between ground and the junction of the resistor 54 and the resistor 52. Degeneration of signal is thereby greatly reduced.

The diode 51 is biased in a reverse direction and is of the type providing a large voltage drop across its terminals while maintaining a low dynamic resistance thereacross. The circuit of FIGURE 3 is thus seen to operate in similar fashion to that of FIGURE 1 except that the alternating current degeneration is eliminated in the circuit of FIGURE 3 as described above.

A stabilizing transistor amplifier circuit which is consistent in operation irrespective of variation in the characteristic of the transistors used therein may be provided in accordance with the present invention. In many applications, separate control of the amount of stabilization and the bias current is achieved with economy in the number of circuit elements required. The circuit is capable of satisfactory operation without adjustment even though transistors having widely varying characteristics are used interchangeably therein.

What is claimed is:

1. A signal translating circuit comprising, in combination, a transistor including base, emitter, and collector electrodes and having under operating conditions a ratio of collector current increments to emitter current increments which is less than unity, circuit means connected between said emitter and base electrodes for applying an input signal thereto, signal output circuit means coupled between said collector and base electrodes, a source of energizing potential and a load resistor connected in series between said collector and emitter electrodes for providing a direct current voltage on said collector electrode which is variable in response to variations in direct collector current, and a stabilizing bias circuit direct-current conductively connected between said collector and base electrodes for providing bias current to said base electrode, said bias circuit including a semi-conductor diode biased in the Zener region by said bias current and providing a direct-current voltage drop in excess of the product of the current flow therethrough and the dynamic resistance thereof, said bias circuit providing a direct bias current for said base electrode which is controlled by the direct current potential at said collector electrode for stabilizing the operating point of said amplifying circuit.

2. A signal translating circuit comprising in combination, a transistor including base, emitter, and collector electrodes and having under operating conditions a ratio of collector current increments to emitter current increments which is less than unity, circuit means connected between said base and emitter electrodes for applying input signal thereto, output circuit means coupled between said collector and emitter electrodes, a source of energizing potential and a resistive load element connected in series relation between said collector and emitter electrodes for providing a direct current voltage on said collector electrode which is variable in response to variations in direct collector current, and a stabilizing bias circuit direct-current conductively connected between said collector and base electrodes for providing bias current to said base electrode, said bias circuit consisting of the series combination of a resistor and a semi-conductor diode biased in a forward direction by said bias current, and providing a direct-current voltage drop in excess of the product of the current flow therethrough and the dynamic resistance thereof, said bias circuit providing a direct bias current for said base electrode which is controlled by the direct current potential at said collector electrode for stabilizing the operating point of said amplifying circuit.

3. A transistor circuit including a transistor having collector, emitter and base electrodes, said transistor being subject to variations in operating point, means for supplying bias voltages for application to said electrodes, means for varying the bias applied to at least one of said electrodes in response to said variations in operating point to provide compensation therefor and stable operation of said transistor, said last named means including a diode rectifier operating in its Zener discharge region, and means connecting said diode rectifier with said means for supplying bias voltages.

4. A signal amplifier circuit comprising in combination, a transistor having base, emitter, and collector electrodes, means for applying an input signal between said base and emitter electrodes, an output circuit coupled with said collector electrode, resistive load means and a source of energizing potential connected in series relation between said collector and emitter electrodes for providing a direct current voltage on said collector electrode which is variable in response to variations in direct collector current, and bias circuit means direct-current conductively connected between said collector and base electrodes for stabilizing the operating point of said amplifying circuit, said bias circuit means including an element providing a direct-current voltage drop in excess of the product of current flow therethrough and the dynamic resistance thereof, thereby providing a direct bias current for said base electrode which varies with and under the control of the direct-current potential at said collector electrode.

5. A signal translating circuit comprising in combination, a transistor including base, emitter, and collector electrodes and having under operating conditions a ratio of collector current increments to emitter current increments which is less than unity, circuit means connected between said base and emitter electrodes for applying an input signal thereto, output circuit means coupled with said collector electrode, resistance means and a source of energizing potential serially connected between said collector electrode and a point of reference potential in said circuit for providing a direct current voltage on said collector electrode which is variable in response to variations in direct collector current, means connecting said emitter electrode with said point of reference potential, and stabilizing bias circuit means direct-current conductively connected between said collector and base electrodes for stabilizing the operating point of said amplifying circuit, said stabilizing bias circuit means including a direct-current conductive element providing a direct-current voltage drop in excess of the product of the current flow therethrough and the dynamic resistance thereof, thereby providing a direct bias current for said base electrode which varies with and under the control with the direct-current potential at said collector electrode.

6. A signal translating circuit comprising in combination, a transistor including base, emitter, and collector electrodes and having under operating conditions a ratio of collector current increments to emitter current increments which is less than unity, circuit means connected between said base and emitter electrodes for applying an input signal thereto, output circuit means coupled between said collector and emitter electrodes, a resistive load element and a source of energizing potential connected in series relation between said collector and emitter electrodes for providing a direct current voltage on said collector electrode which is variable in response to variations in direct collector current, and stabilizing bias circuit means direct-current conductively connected between said collector and base electrodes for stabilizing the operating point of said amplifying circuit, said stabilizing bias circuit means including a semi-conductor diode providing a direct-current voltage drop in excess of the product of the current flow therethrough and the dynamic resistance thereof, thereby providing a direct bias current for said base electrode which varies with and under the control of the direct-current potential at said collector electrode.

7. A signal translating circuit comprising in combination, a transistor including base, emitter, and collector electrodes and having under operating conditions a ratio of collector current increments to emitter current increments which is less than unity, circuit means connected between said base and emitter electrodes for applying an input signal thereto, output circuit means coupled between said collector and emitter electrodes, a load resistor and a source of energizing potential connected in series between said collector and emitter electrodes for providing a direct-current voltage on said collector electrode which is variable in response to variations in direct collector current, and stabilizing bias circuit means direct-current conductively connected between said collector and base electrodes for stabilizing the operating point of said amplifying circuit by providing bias current to said base electrode, said stabilizing bias circuit means including a semi-conductor diode biased in the Zener region by said bias current and providing a direct-current voltage drop in excess of the product of current flow therethrough and the dynamic resistance thereof, whereby said direct bias current for said base electrode varies with and under the control of the direct-current potential at said collector electrode.

8. A signal translating circuit comprising in combination, a transistor including base, emitter, and collector electrodes and having under operating conditions a ratio of collector current increments to emitter current increments which is less than unity, circuit means connected between said base and emitter electrodes for applying input signals thereto, output circuit means coupled between said collector and emitter electrodes, and a resistive load element and a source of energizing potential connected in series relation between said collector and emitter electrodes for providing a direct-current voltage on said collector electrode which is variable in response to variations in direct collector current, and stabilizing bias circuit means direct-current conductively connected between said collector and base electrodes for stabilizing the operating point of said amplifying circuit by providing bias current to said base electrode, said stabilizing bias circuit means consisting of the series combination of a resistor and a semiconductor diode biased in the Zener region by said bias current and providing a direct-current voltage drop in excess of the product of the current flow therethrough and the dynamic resistance thereof, whereby said direct bias current for said base electrode varies with and under the control of the direct-current potential at said collector electrode.

References Cited in the file of this patent

UNITED STATES PATENTS

| | | |
|---|---|---|
| 2,693,572 | Chase | Nov. 2, 1954 |
| 2,714,702 | Shockley | Aug. 2, 1955 |
| 2,751,550 | Chase | June 19, 1956 |
| 2,762,873 | Goodrich | Sept. 11, 1956 |